Figure 4:
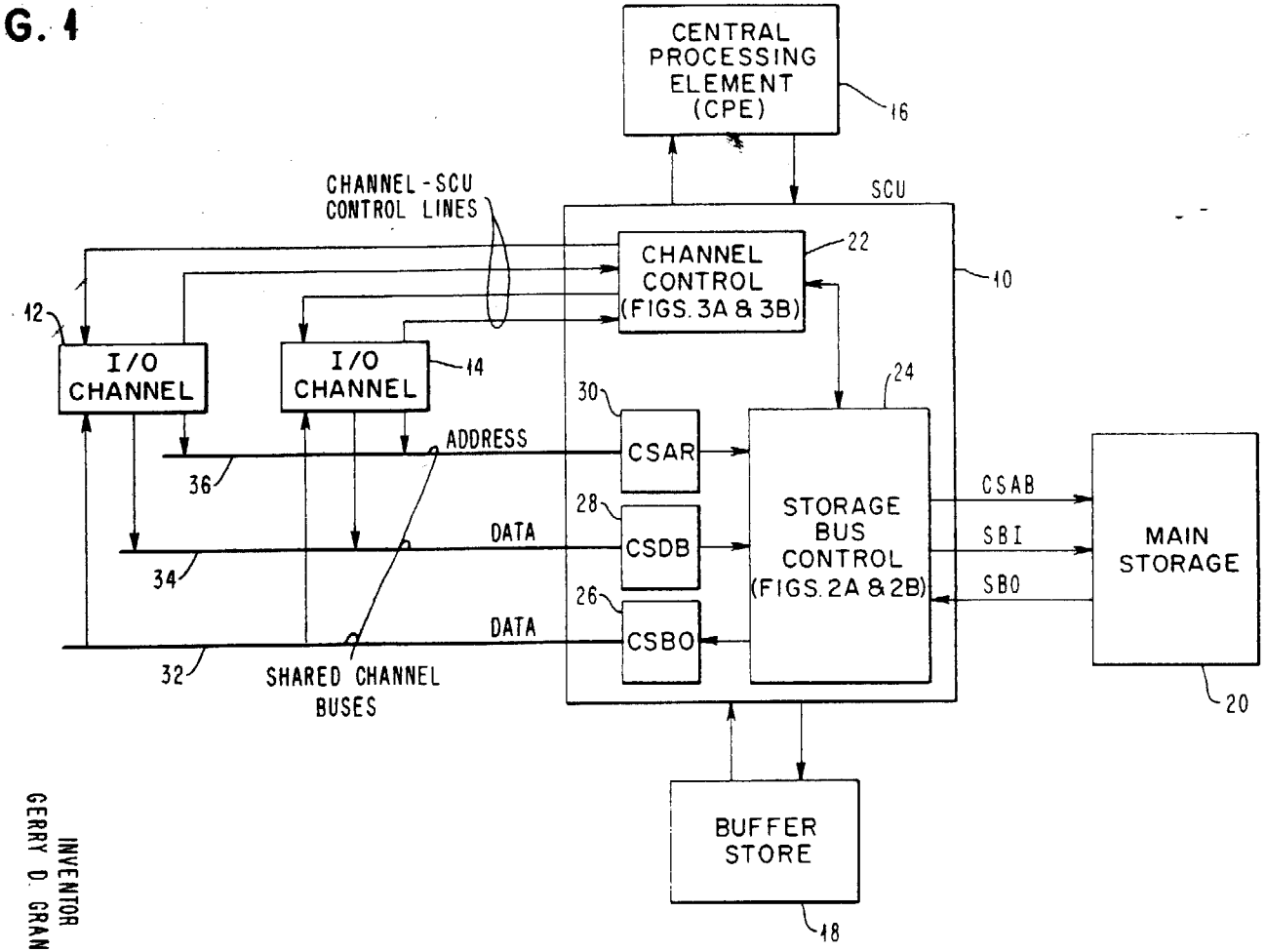
Figure 2B:
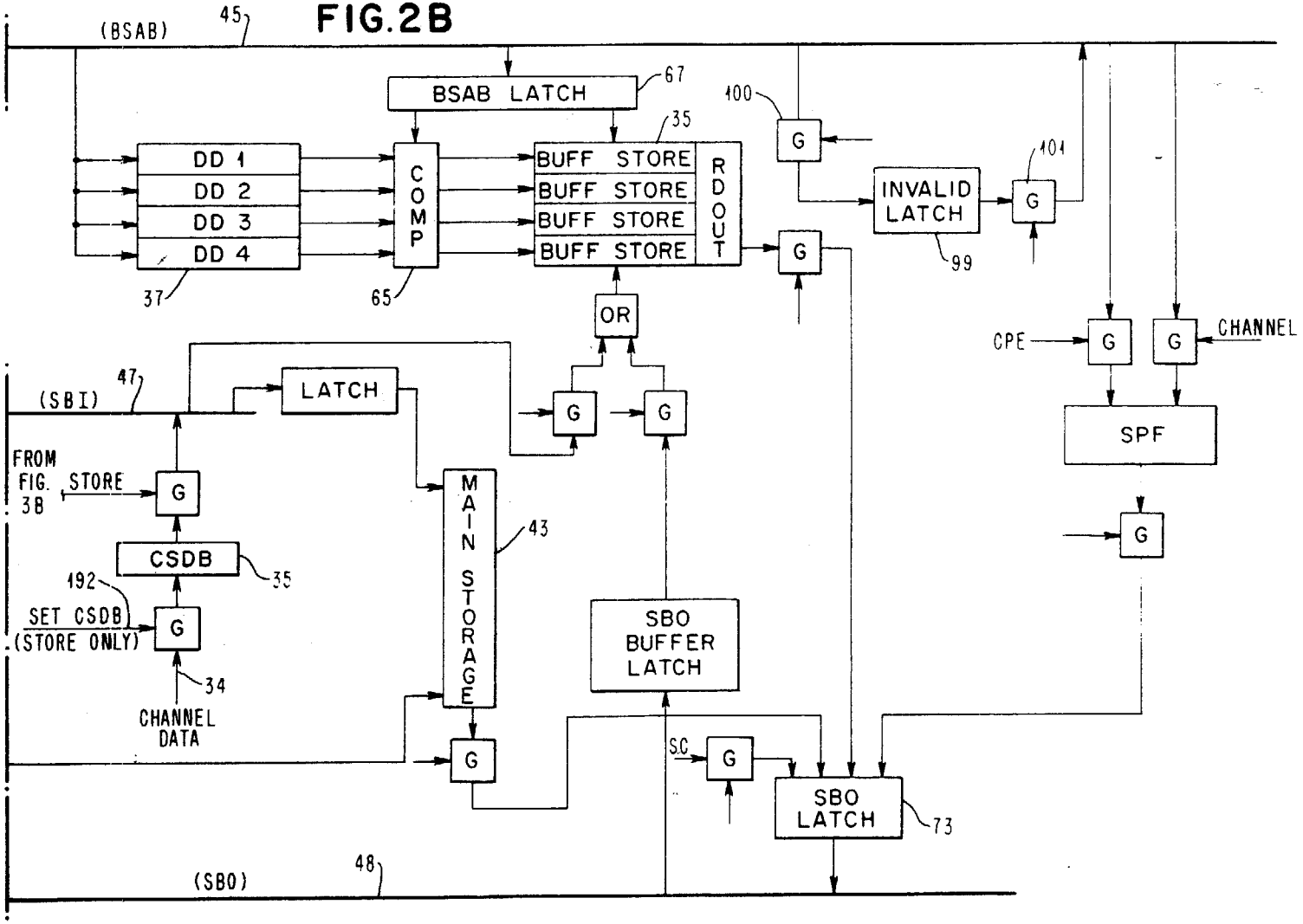
Figures 3, 3A:
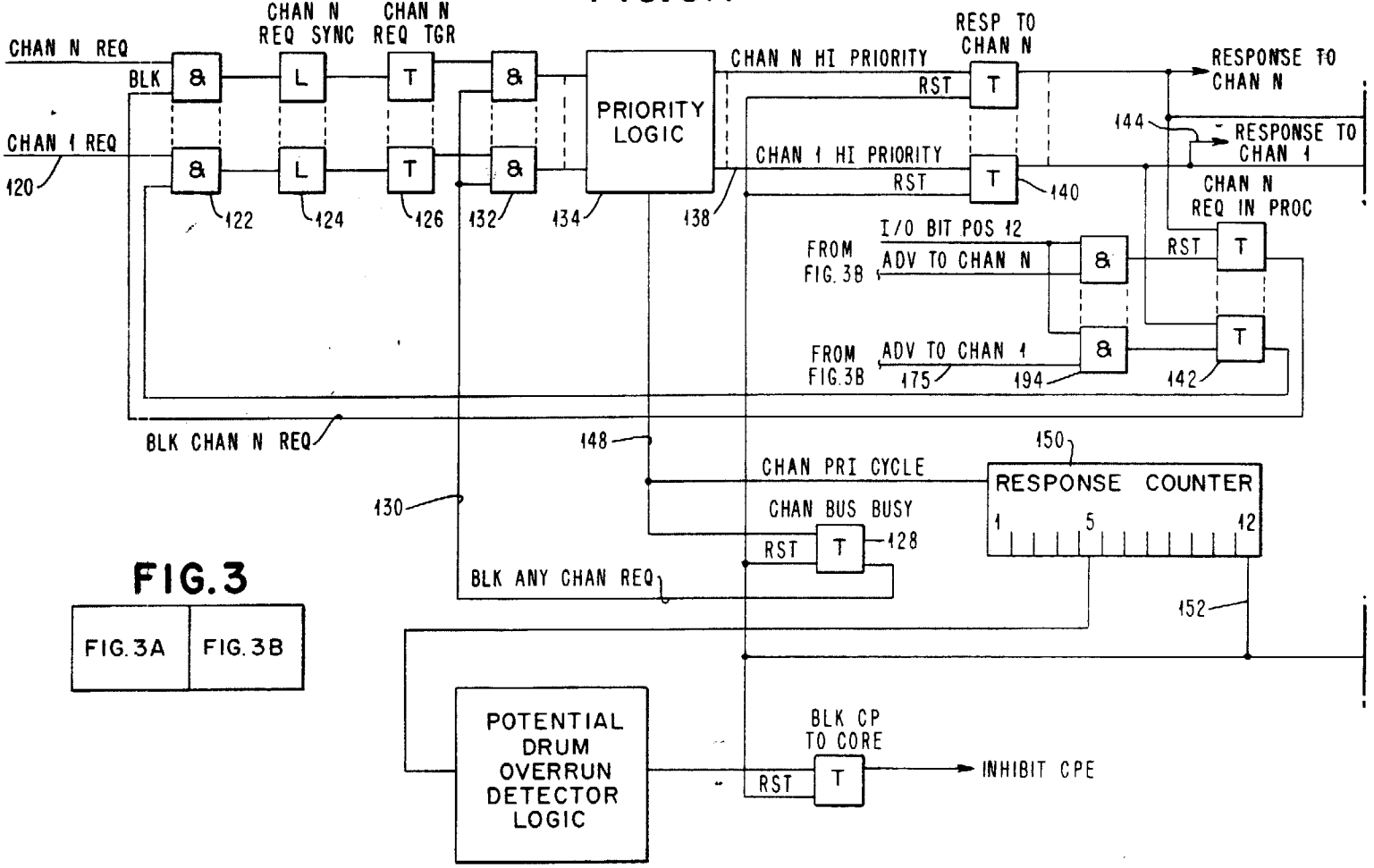
Figure 3B:
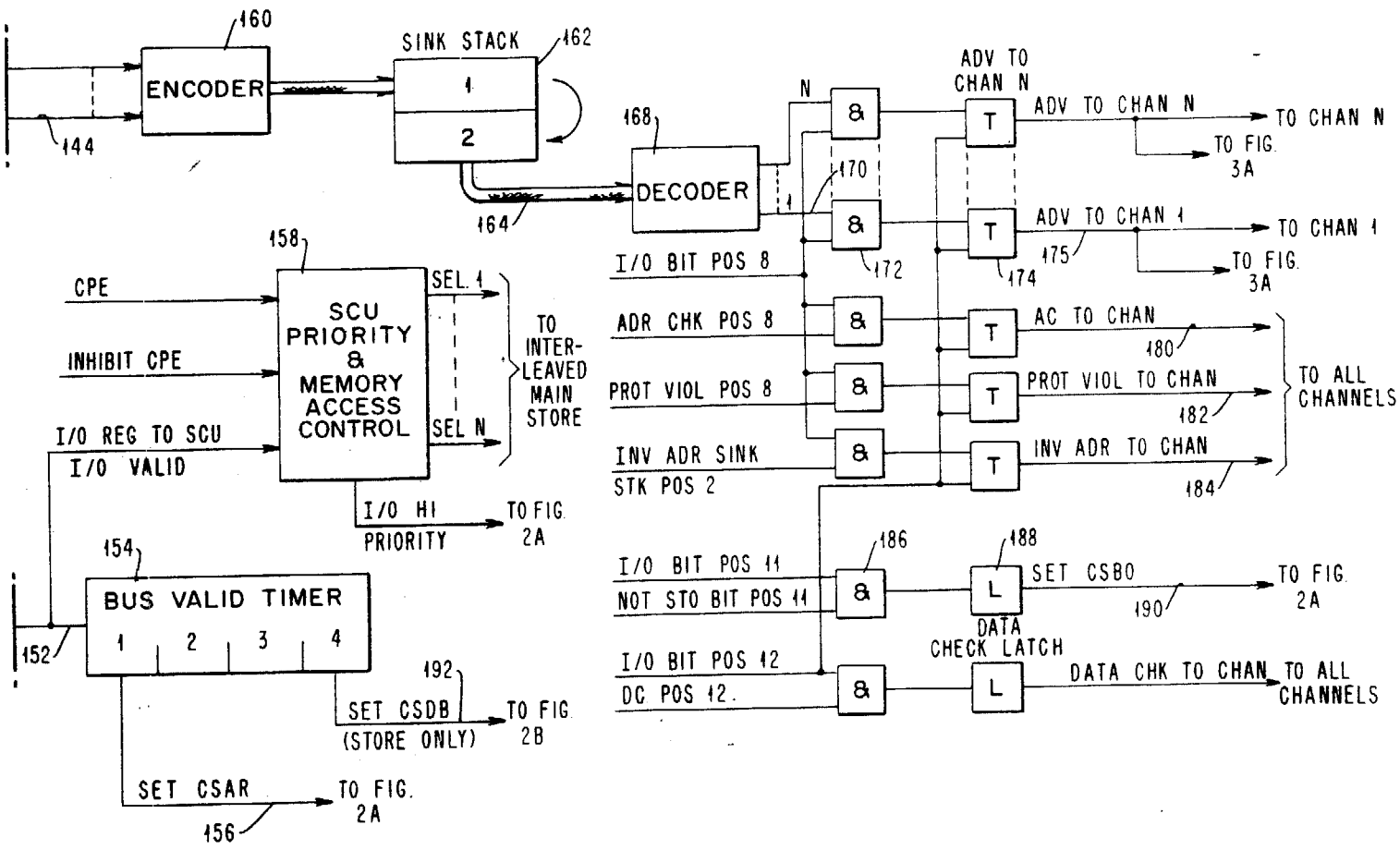
Figure 4:
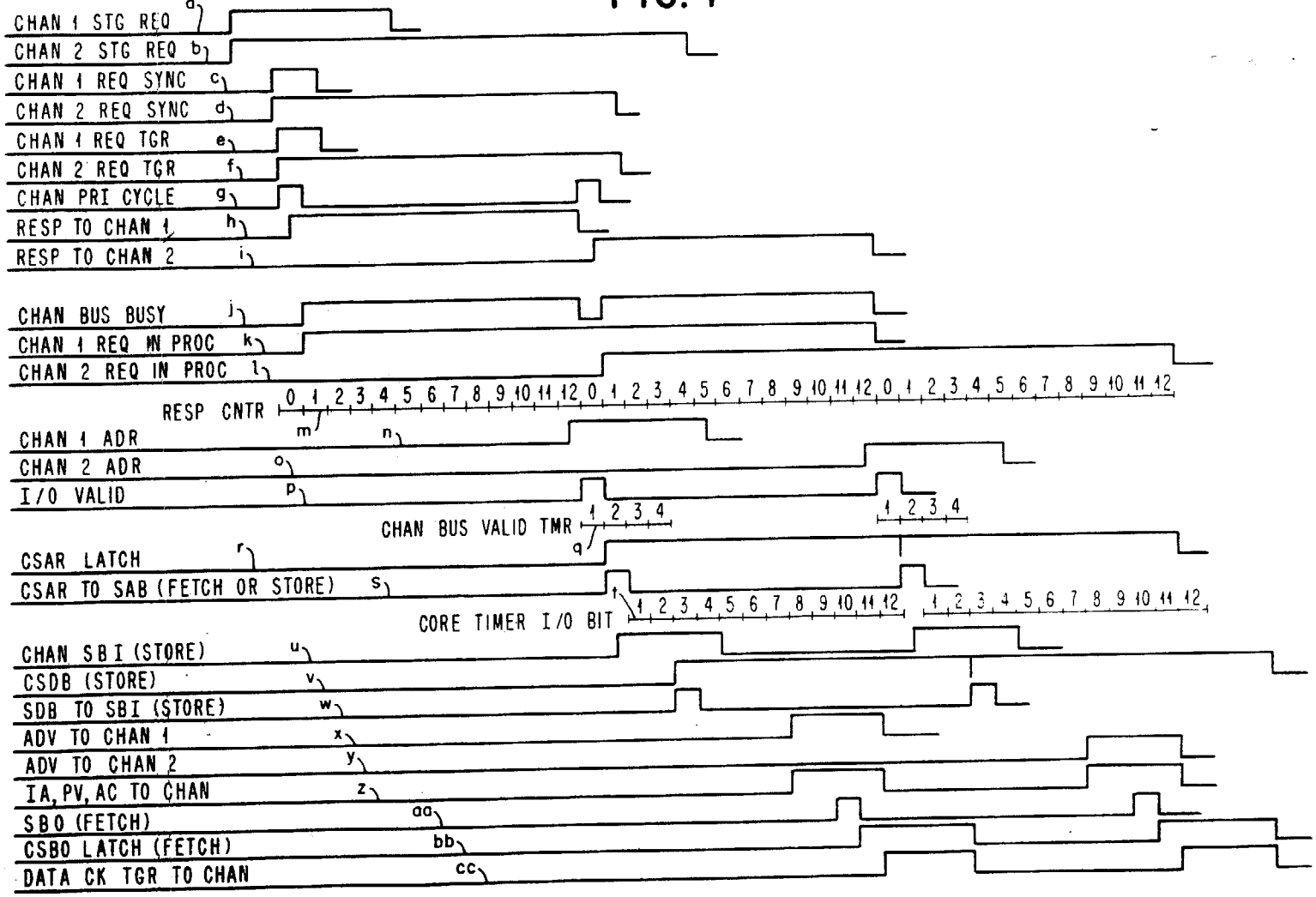
Figure 7:
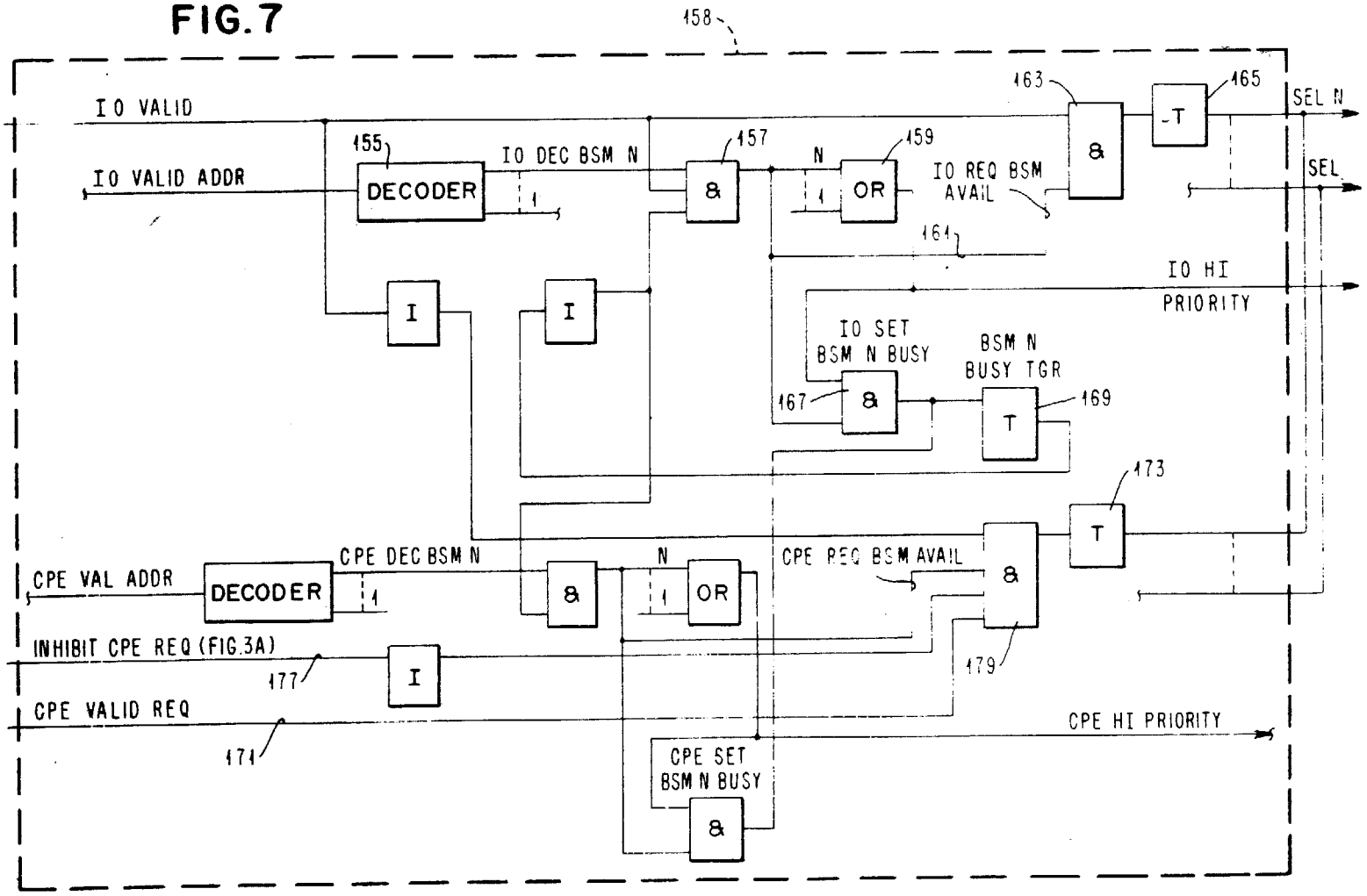

710-74 Y5506 $$$ SR
5506Y OR T 915,002

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED OCTOBER 9, 1973

915 O.G. 383

T915,002

CHANNEL-MEMORY BUS CONTROL

Gerry D. Granito, Poughkeepsie, N.Y., assignor to International Business Machines Corporation, Armonk, N.Y.

Continuation-in-part of application Ser. No. 46,081, June 15, 1970. This application Oct. 13, 1972, Ser. No. 294,707

**Int. Cl. G11c *25/00***
U.S. Cl. 340—172.5
8 Sheets Drawing. 21 Pages Specification

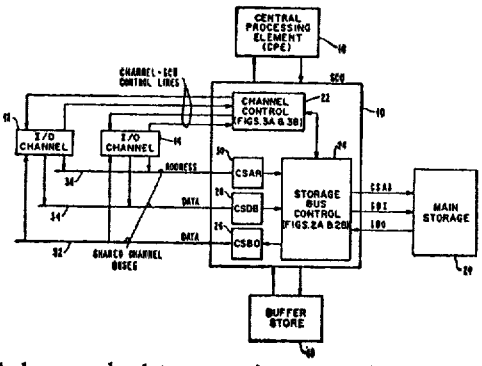

A large scale data processing system having a high speed low capacity buffer store for buffering data fetch and data store requests to a low speed high capacity interleaved main storage. Requests for storage may come from a plurality of channels which communicate with a storage control unit (SCU) over shared address and data buses. Multiple channel requests are sequenced over this shared bus. The storage control unit controls this sequencing by means of priority circuits and upon granting priority to one of the channels, provides for memory selection. In the case of multiple simultaneous channel requests, the storage control unit unconditionally accepts a request every memory cycle. Upon arrival at the storage control unit, the address and data corresponding to the request are held in registers pending the availability of the requested storage thereby freeing the channel bus for acceptance of another request. The maximum delay that the registered request can encounter is one memory cycle, therefore, the next accepted request will find the register available when it arrives at the storage control unit.

710-74 Y5506 $$$ SR
5506Y OR T 915,002

Oct. 9, 1973 G. D. GRANITO T915,002

CHANNEL-MEMORY BUS CONTROL

Filed Oct. 13, 1972 8 Sheets-Sheet 1

INVENTOR
GERRY D. GRANITO

BY Owen Lamb
ATTORNEY

Oct. 9, 1973 G. D. GRANITO T915,002
CHANNEL-MEMORY BUS CONTROL
Filed Oct. 13, 1972 8 Sheets-Sheet 8
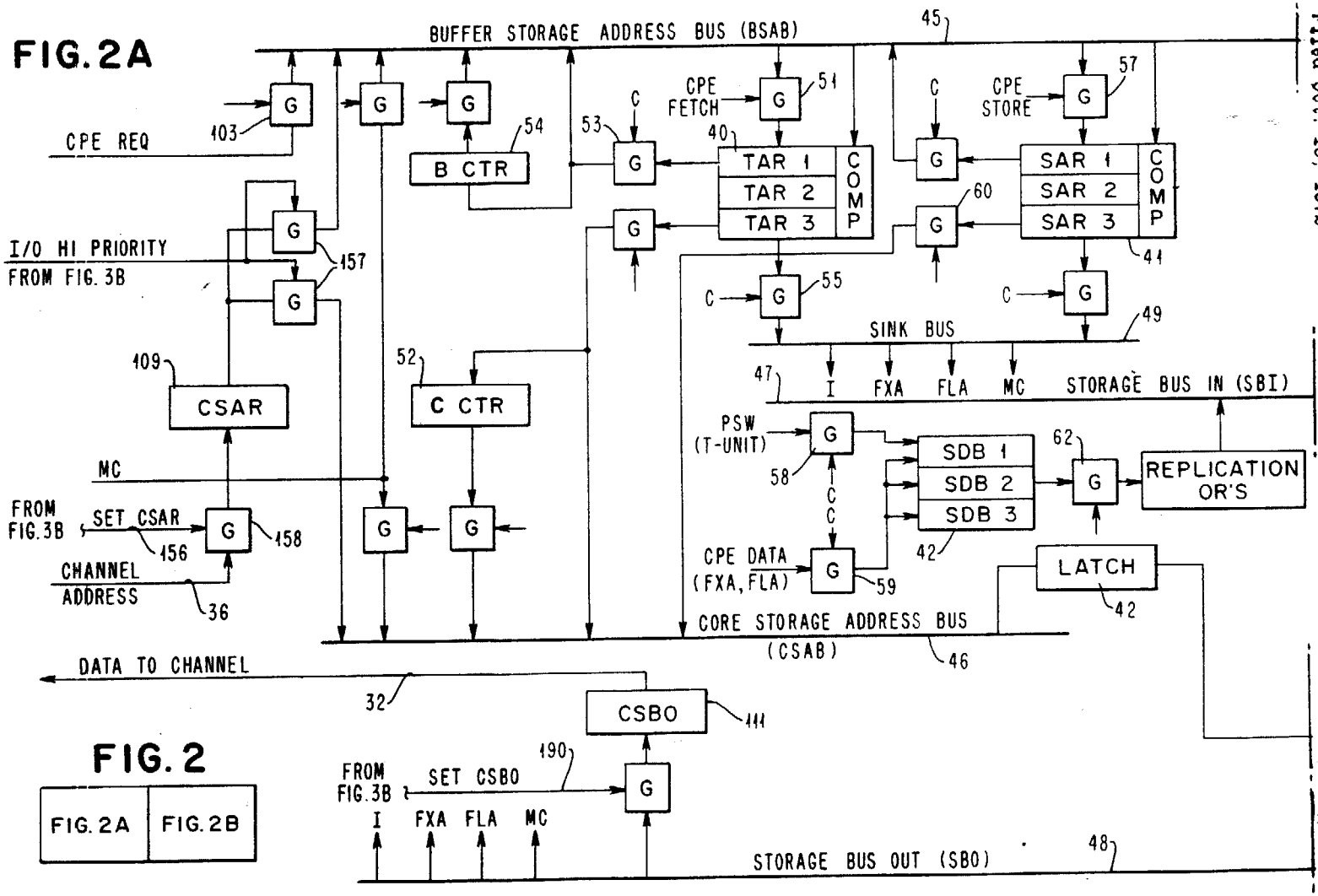

Oct. 9, 1973 G. D. GRANITO T915,002
CHANNEL-MEMORY BUS CONTROL
Filed Oct. 13, 1972 8 Sheets-Sheet 3

Oct. 9, 1973 G. D. GRANITO T915,002

CHANNEL-MEMORY BUS CONTROL

Filed Oct. 13, 1972 8 Sheets-Sheet 4

| FIG. 3A | FIG. 3B |
|---|---|

Oct. 9, 1973 G. D. GRANITO T915,002
CHANNEL-MEMORY BUS CONTROL
Filed Oct. 13, 1972 8 Sheets-Sheet 5

Oct. 9, 1973 G. D. GRANITO T915,002

CHANNEL-MEMORY BUS CONTROL

Filed Oct. 13, 1972 8 Sheets-Sheet 6

Oct. 9, 1973 G. D. GRANITO T915,002
CHANNEL-MEMORY BUS CONTROL
Filed Oct. 13, 1972 8 Sheets-Sheet 7
FIG. 5 PRIORITY LOGIC
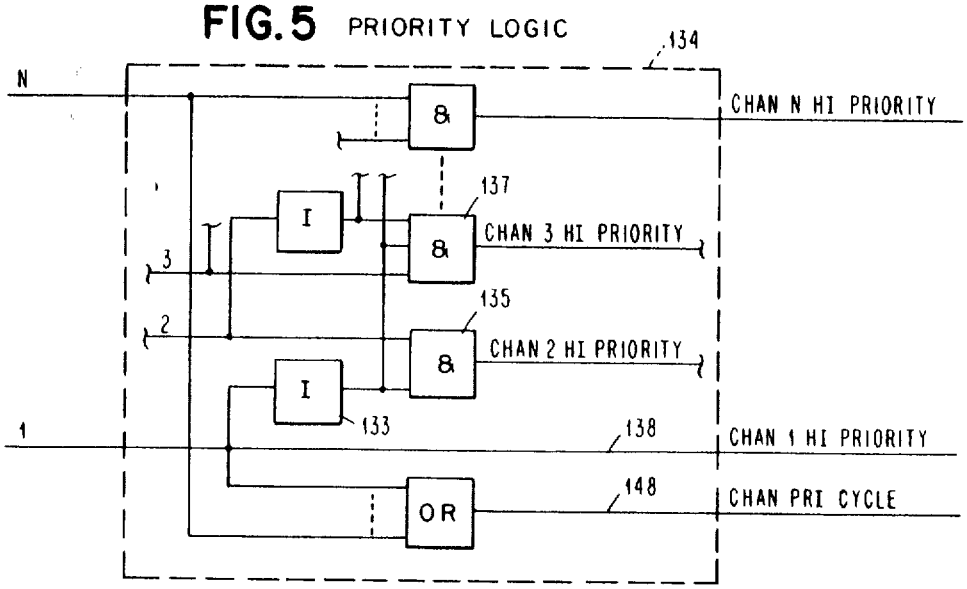
FIG. 6 POTENTIAL DRUM OVERRUN DETECTOR LOGIC FOR 3RD CHAN
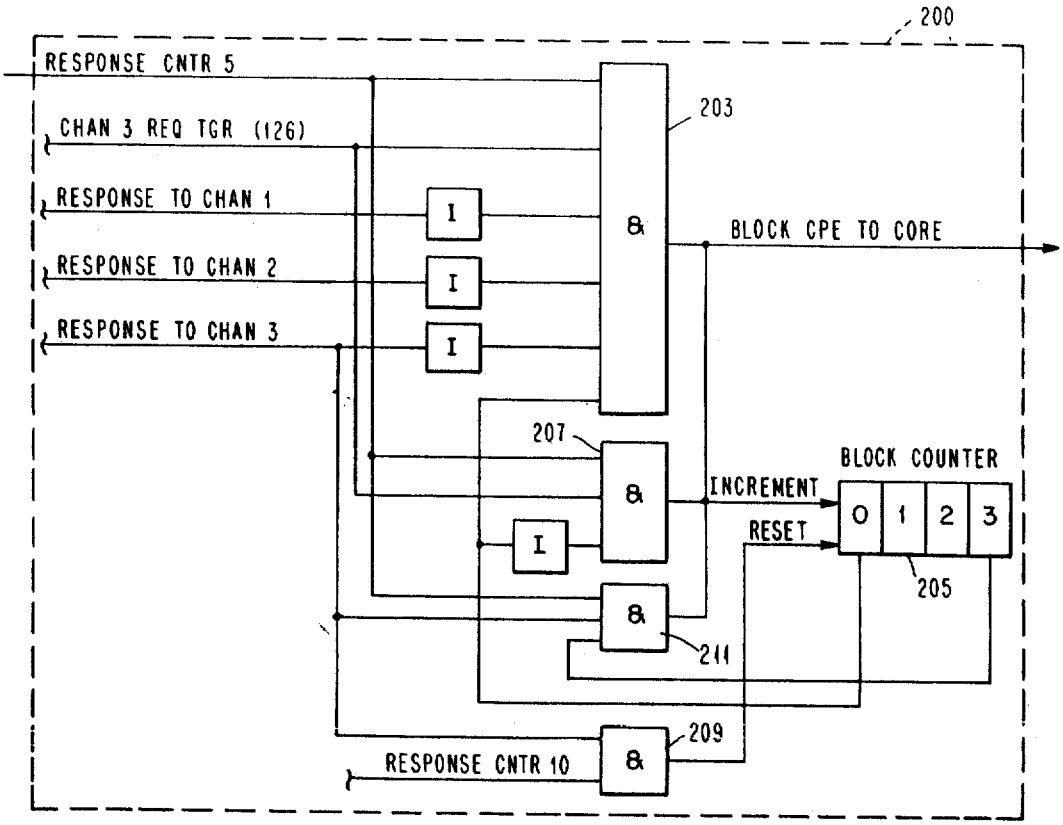

Oct. 9, 1973 G. D. GRANITO T915,002

CHANNEL-MEMORY BUS CONTROL

Filed Oct. 13, 1972 8 Sheets-Sheet 8